US008736085B2

(12) United States Patent
Sines (10) Patent No.: US 8,736,085 B2
(45) Date of Patent: May 27, 2014

(54) METHOD AND APPARATUS FOR DIRECT ENERGY CONVERSION

(76) Inventor: Eddie Sines, Manassas, VA (US)

( * ) Notice: Subject to any disclaimer, the term of this patent is extended or adjusted under 35 U.S.C. 154(b) by 567 days.

(21) Appl. No.: 12/308,049

(22) PCT Filed: Jun. 13, 2007

(86) PCT No.: PCT/US2007/013800
§ 371 (c)(1),
(2), (4) Date: May 26, 2009

(87) PCT Pub. No.: WO2008/005158
PCT Pub. Date: Jan. 10, 2008

(65) Prior Publication Data
US 2009/0315337 A1    Dec. 24, 2009

Related U.S. Application Data

(60) Provisional application No. 60/813,341, filed on Jun. 14, 2006.

(51) Int. Cl.
*F02B 63/04*    (2006.01)

(52) U.S. Cl.
USPC .......................................... 290/1 R; 505/150

(58) Field of Classification Search
USPC .................. 290/1 R; 505/181, 150, 182, 876
See application file for complete search history.

(56) References Cited

U.S. PATENT DOCUMENTS

| 3,790,880 | A  |         | 2/1974  | Solomon       |
|-----------|----|---------|---------|---------------|
| 3,956,727 | A  |         | 5/1976  | Wolf          |
| 4,336,523 | A  |         | 6/1982  | Jaggi         |
| 5,268,530 | A  |         | 12/1993 | Shimizu et al.|
| 5,430,008 | A  |         | 7/1995  | Morris        |
| 5,432,382 | A  | *       | 7/1995  | Pawlowski ................... 290/1 R |
| 5,446,319 | A  | *       | 8/1995  | Pawlowski ................... 290/1 R |
| 5,475,560 | A  |         | 12/1995 | Onishi et al. |
| 6,756,719 | B1 | *       | 6/2004  | Chiu .............................. 310/257 |

(Continued)

FOREIGN PATENT DOCUMENTS

RU          2234161 C1 *  6/2003

OTHER PUBLICATIONS

Introduction to Electrodynamics, Davis J. Griffiths, 1999, Prentice Hall Inc, p. 207.*
On-site Power Generation, Gordon Johnson, EGSA 1993, p. 22-23.*
Faradays Law of Induction, Wikipedia, 2007.*
Lester R. Moskowitz, "Permanent Magnet Design and Application Handbook", 1976, pp. 101-104, ISBN 0-89874-863-1, R. E. Krieger Publishing Company, Malabar, Florida, U.S.A.

(Continued)

*Primary Examiner* — Nguyen N Hanh
(74) *Attorney, Agent, or Firm* — IP-R-US, LLC; Peter S. Wong (57) ABSTRACT

A method and apparatus for direct energy conversion that combines the properties of Type II superconductor thin films, including the Meissner effect to create vortices to control and modulate static flux coupled in a magnetic circuit, where the laws of induction are used to produce an electrical signal without the use of moving armatures. The dynamics of magnetic flux modulation results from suppression of superconductivity and the Meissner effect by external photon irradiation. The apparatus employs a vortex channel based on the Meissner Effect, a laser, a permanent magnet, fiber optics for carrying the laser beam to the vortex channel, and a transformer composed of two separate windings. The transformer windings are arranged in a circuit having a first path through the permanent magnet and a first coil of the transformer windings; and a second path through the permanent magnet, the vortex channel, and the second coil of the transfer windings.

18 Claims, 9 Drawing Sheets

(56) References Cited

U.S. PATENT DOCUMENTS

| | | | |
|---|---|---|---|
| 7,019,608 B2 | 3/2006 | Darmann | |
| 7,098,559 B2 * | 8/2006 | Travers | 310/10 |
| 7,786,887 B2 * | 8/2010 | Schmidt | 340/693.1 |
| 2009/0184635 A1 * | 7/2009 | Pan et al. | 313/504 |
| 2009/0315337 A1 * | 12/2009 | Sines | 290/1 R |
| 2012/0088674 A1 * | 4/2012 | Faley et al. | 505/162 |
| 2012/0313452 A1 * | 12/2012 | Corbett et al. | 307/106 |

OTHER PUBLICATIONS

Michael Tinkham, "Introduction to Superconductivity, 2nd Edition", 1996, pp. 22-23 & 156, ISBN 0-486-43503-2, Dover Publications, Inc. Mineola, New York, U.S.A.

Henrik Jeldtoft Jensen, "Self-Organized Criticality", 1998, pp. 18-22, ISBN 0-521-48371-9, Cambridge University Press, New York, U.S.A.

* cited by examiner

METHOD AND APPARATUS FOR DIRECT ENERGY CONVERSION

CROSS-REFERENCE TO RELATED APPLICATIONS

The present patent application is a nationalization of International application No. PCT/US2007/013800, filed Jun. 13, 2007, published in English, which is based on, and claims priority from, U.S. provisional Application No. 60/813,341, filed Jun. 14, 2006, both of which are incorporated herein by reference in their entirety.

BACKGROUND OF THE INVENTION

1. Field of the Invention

The present invention relates to a method and apparatus for direct energy conversion. More specifically, the invention relates to a method and apparatus for direct energy conversion for converting the optical energy of an external photon beam into electricity by employing the unique properties of Type II high temperature superconductors.

2. Related Art

The following definitions are used herein:

Atomic Force In the normal state of matter, electrons are kept apart by mutual repulsion based on their electrostatic and magnetic properties. In the case of Type II superconductors, for example, YBCO, electrons that normally repel one another experience an overwhelming attraction to link up and form Cooper pairs when the material drops below its critical temperature, $T_c$. When these electrons form Cooper pairs, they take on the character of bosons, meaning that all the electrons have the same spin and energy level. Only bosons can condense and occupy a ground state that has a lower total energy than that of the normal ground state. This behavior suggests that Cooper pairs are coupling over hundreds of nanometers, three orders of magnitude larger than the crystal lattice spacing. The effective net attraction between the normally repulsive electrons produces binding energy on the order of milli-electron volts, enough to keep them paired at low temperatures. Electrons in the Cooper pair state can be considered compressed because they are closer to each other than in the normal (non-superconducting) state. In many ways, Cooper pair electrons are much like a mechanical spring under compression. The atomic force is defined as the compressive force provided by millions of Cooper pairs in this ground state. The available potential energy increases when electrons close their interaction distance. This potential energy is released when the Cooper pair electrons absorb the energy of photons and are forced to revert from their lower total energy ground state to the higher total energy normal ground state. When this happens, the potential energy is released in a fraction of a second, producing spontaneous symmetry breaking (also known as Photon Cooper Pair Breaking). The cycle is repeated once the electron ejects a photon of a lower energy level and transitions back to the lower total energy ground state.

B: The magnetic field in which a superconductor is placed

Cooper pair: Two electrons that are bound together in accordance with the conventional Bardeen-Cooper-Schrieffer theory of superconductivity, despite the fact that they both have a negative charge and normally repel each other. Below the superconducting transition temperature $T_c$, paired electrons form a condensate (a macroscopically occupied single quantum state), which flows without resistance.

Flux lines: A magnet's lines of force.

Fluxoid (also known as flux line, fluxon, vortex): One of the microscopic filaments of magnetic flux that penetrates a Type II superconductor in the mixed state, consisting of a normal core in which the magnetic field is large, surrounded by a superconducting region in which flows a vortex of persistent supercurrent which maintains the field in the core.

Conventional Flux-Pinning: The phenomenon where a magnetic flux become trapped or "pinned" inside a current-carrying Type II superconducting material in spite of the Lorentz force acting to expel it from inside the Type II superconducting material. Flux pinning is only possible when there are defects in the crystalline structure of the superconductor (usually resulting from grain boundaries or impurities).

$H_{c2}$: The "upper critical field" or maximum magnetic field that a superconductor can endure before it is "quenched" and returns to a non-superconducting state. Usually a higher $T_c$ also brings a higher $H_{c2}$.

Meissner Effect: The exhibiting of diamagnetic properties to the total exclusion of all magnetic fields. The Meissner Effect is a classic hallmark of superconductivity.

Quantum efficiency: In an optical source or detector, the ratio of the number of output quanta to the number of input quanta.

Quench: The phenomenon where superconductivity in a material is suppressed; usually by exceeding the maximum current the material can conduct ($J_c$) or the maximum magnetic field it can withstand ($H_c$).

$T_c$: The critical transition temperature below, which a material begins to superconduct.

Thin Film (Deposition): A process for fabricating ceramic superconductors to more precisely control the growth of the crystalline structure to eliminate grain boundaries and achieve a desired Tc. Two types of thin film deposition are Pulsed-Laser Deposition (PLD) and Pulsed-Electron Deposition (PED) of the material.

Vortices (plural of vortex): Swirling tubes of electrical current induced by an external magnetic field into the surface of a superconducting material that represent a topological singularity in the wave function. These are particularly evident in Type II superconductors during "mixed-state" behavior when the surface is just partially superconducting. Superconductivity is completely suppressed within these volcano-shaped structures. The movement of vortices can produce a resistance and, as such, is undesirable. While superconductivity is a "macroscopic" phenomenon, vortices are a "mesoscopic" phenomenon.

YBCO: An acronym for a well-known ceramic superconductor composed of Yttrium, Barium, Copper and Oxygen. YBCO was the first truly "high temperature" ceramic superconductor discovered, having a transition temperature well above the boiling point of liquid nitrogen (a commonly available coolant). Its actual molecular formula is $YBa_2Cu_3O_7$, making it a "1-2-3" superconductor. YBCO compounds exhibit d-wave electron pairing.

Superconductivity, discovered in 1911 by Heike Kamerlingh Onnes, is a phenomenon occurring in many electrical conductors at extremely low temperatures (on the order of −200° Celsius). In this phenomenon, the electrons responsible for conduction undergo a collective transition into an ordered state, an electronic fluid consisting of Cooper pairs. Attractive force between electrons from the exchange of phonons causes the pairing of electrons in Cooper pairs. As a result of its ordered state, the Cooper pair fluid has many unique and remarkable properties, including the vanishing of resistance to the flow of electric current, the appearance of a large diamagnetism and other unusual magnetic effects, substantial alteration of many thermal properties, and the occurrence of quantum effects otherwise observable only at the atomic and subatomic level.

One of the unusual magnetic effects exhibited by superconductors is the Meissner (or Meissner-Ochsenfeld) Effect. Meissner and Ochsenfeld discovered that a metal cooled into the superconducting state in a moderate magnetic field expels the field from its interior. Superconductors are defined as having "a state of perfect diamagnetism." Perfect diamagnetism implies that the superconducting material does not permit an externally applied magnetic field to penetrate into its interior. Effectively, superconductors block magnetic fields by modifying the magnetic length path, which is known as reluctance.

The exclusion of magnetic flux by a superconductor costs some magnetic energy. As long as this cost is less than the condensation energy gained by going from the normal to the superconducting phase, the superconductor will remain completely superconducting in an applied magnetic field. If the applied field becomes too large, the cost in magnetic energy will outweigh the gain in condensation energy, and the superconductor will become partially or totally normal. The manner in which this occurs depends on the geometry and the material of the superconductor. The geometry that produces the simplest behavior is that of a very long cylinder with the magnetic field applied parallel to its axis. Two distinct types of behavior may then occur, depending on the type of superconductor—Type I or Type II.

Below a critical magnetic field $H_c$, which increases as the temperature decreases below $T_c$, the magnetic flux is excluded from a type I superconductor, which is said to be perfectly diamagnetic. For a Type II superconductor, there are two critical magnetic fields, the lower critical magnetic field $H_{c1}$ and the upper critical magnetic field $H_{c2}$. In applied magnetic fields less than $H_{c1}$, the superconductor completely excludes the magnetic field, just as a type I superconductor does below $H_c$. At magnetic fields just above $H_{c1}$, however, flux begins to penetrate the superconductor, not in a uniform way, but as individual, isolated microscopic filaments called fluxoids or vortices, each carrying one quantum of magnetic flux, h/2e. In other words, high levels of static flux are also known to cause vortices in Type II superconductors. The flux penetration is hindered by microscopic inhomogeneities that pin (trap) vortices. As a result, a critical state is formed with some gradient of flux density determined by the critical current.

Vortices provide a means to modulate static flux because they produce a magnetic channel whereby the static flux moves unhindered, without losses from one point to a second point. When a Type II superconductor is placed in a magnetic field B, where $H_{c1}<B<H_{c2}$, and where $H_{c1}$ and $H_{c2}$ are the lower and upper critical fields, respectively, the magnetic vortices that penetrate the material should form a uniform triangular lattice (Abrikosov vortex lattice), with a lattice spacing determined by the strength of B. If B is increased, the vortices become more closely spaced and their cores start to overlap. At $H_{c2}$ the vortex lattice and the Cooper pairing of the electrons disappear and the material becomes normal.

Anisotropy effects are fundamental to superconductivity. Just about all-crystalline superconductors are in principle expected to show some anisotropy effects. There are several classes of materials with anisotropic superconducting properties, including the class of bulk anisotropic superconductors (for example, some of the transition metals) and the class of superconducting thin films. When the thickness of a film is less than the coherence length, the Cooper pairs can only interact with their neighbors in the plane of the film. In this case, the film is commonly referred to as a two-dimensional superconductor, because the Cooper pairs only interact in two directions.

Lowering the effective dimensionality of a superconductor from three to two dimensions has important and measurable consequences, deriving from the fact that the length scale for superconductivity in the direction perpendicular to the film is now the film thickness rather than the coherence length. Usually, layered superconductors show 3D anistropic superconductivity like the bulk transition metals, but sometimes they show 2D superconductivity like thin films, and sometimes they even show entirely new effects.

Research indicates that when a superconductor is irradiated by a laser, the photons get absorbed by the Cooper pairs and this leads to pair breaking. Under certain conditions, a pair breaking avalanche may occur. Previously published research findings show a high quantum pair-breaking efficiency from photons.

It is a well-known fact that permanent magnets produce a static flux that emanates off their end poles. Many devices have been invented that use this static flux to produce electrical power we use today. Static flux is ideal for converting mechanical energy into electrical energy. The basic process has not changed in 100 years. The most common method uses a moving armature that rotates inside windings, making and breaking the magnetic circuit. As Faraday and Maxwell discovered, only then can the static flux be used to extract energy. Faraday's law of induction (Equation 1) states that there is a counter electromotive force generated in a coil of wire when there is a difference in flux over time:

$$\varepsilon = -N\frac{d\Phi_B}{dt} \qquad \text{(Eq. 1)}$$

where the magnetic flux $\Phi_B$=B A cos θ, and where N is the number of turns of the wire, B is the magnetic field, A is the surface area of the coil, and θ is the angle between B and a line drawn perpendicular to the face of the coil.

The minus sign signifies that the direction of the induced EMF will be such that the magnetic field produced by the induced EMF resists the change in magnetic flux. The presence of the minus sign is referred to as Lenz's Law.

If a device can produce a difference in the flux density passing through a typical coil, then Faraday's law states there would be a counter electromotive force developed across the windings. All of the present day devices that use mechanical energy perform this one simple task. Regardless of the complexity, the device only makes and breaks the flux lines, thereby creating a difference in flux, causing the secondary effect known as counter EMF.

SUMMARY OF THE INVENTION

It is a primary object of the present invention to provide a method and apparatus for converting optical energy into electrical energy by modulating magnetic flux emanating from the poles of permanent magnets.

It is another object of the present invention to provide a device that will provide electrical energy to power any electrical load without producing any additional $CO_2$ emissions.

It is still another object of the present invention to use Type II superconductors in the conversion of optical energy into electrical energy.

It is still another object of the present invention to provide a method and apparatus for converting the energy of electromagnetic radiation into electrical energy by using vortex channels as a means of modulating the static magnetic flux of permanent magnets, whereby electricity is produced.

It is still another object of the present invention to provide a method and apparatus for producing an electrical signal using the conventional law of induction, but without the use of moving armatures.

These and other objects are achieved by a direct energy conversion generator that combines the known properties of Type II superconductors, including the Meissner Effect, to create vortices to control and modulate static flux coupled in a conventional magnetic circuit, where the laws of induction are used to produce an electrical signal. This effect relies on the Lenz's law (the external photon energy is converted into an electric signal via Lenz' law), but does not require the use of moving armatures. The dynamics of magnetic flux result from suppression of superconductivity and the Meissner effect by external photon irradiation.

The direct energy conversion generator employs a vortex channel based on the Meissner Effect known to expel and pin a fixed magnetic field of a specific value emanating from the poles of a permanent magnet. A laser, a permanent magnet with an axial channel coincident with the magnet's axis, fiber optics for carrying photons from the laser through the axial channel of the magnet to the vortex channel, a diffusing mechanism between the permanent magnet and the vortex channel for evenly expanding the photon beam to the diameter of the vortex channel, and a transformer composed of two separate windings. The diffusing mechanism can be a thin diffusing lens or any other mechanism that can diffuse the incoming photons from the point source provided by the fiber optics into a larger area capable of covering the frontal surface area of the vortex channel. The transformer windings are arranged in a circuit having a first path through the permanent magnet and a first coil of the transformer windings; and a second path through the permanent magnet, the vortex channel, and the second coil of the transfer windings.

The vortex channel comprises a plurality of vortex tubes of circular cross-section arranged in a bundle with their longitudinal axes parallel to each other. The cross-section of the bundle can be any configuration, for example, approximately circular, approximately square, and approximately rectangular, etc. The number of vortex tubes in the bundle is on the order of hundreds or thousands.

The vortex tubes are glass or any appropriate material tubes having an exterior surface (which includes the tube ends), a first buffer layer covering the exterior surface, a second buffer layer covering the first buffer layer, a Type II superconductor thin film covering the second buffer layer, and an insulating layer covering the superconductor thin film. The vortex tubes are switchable between a superconducting state and a non-superconducting state; and work together as a vortex channel to guide static magnetic flux in one direction from one end of the vortex tubes to the other.

The photon wavelength emitted by the laser needs to be tuned precisely to the point, where the Cooper pair breaking processes are the most effective. Type II YBCO material is known to have a very sharp resonance at 930 nm, at which it will absorb photons at extremely high efficiencies, causing it to revert back to the non-superconducting state.

When the vortex channel is in the non-super conducting state, it acts as a ceramic or insulator having the permeability of air, flux is free to flow through the first path. When the vortex channel is in the superconducting state, it guides flux quanta through the vortex channel. The magnetic flux is held in a compressed closed loop, and flux flows through the second path.

Photon Cooper breaking is used to toggle the Type II superconductor thin film (and thus the vortex channel) between the superconducting state and the non-superconducting state, thereby providing a time-varying magnetic field enabling power to be extracted using traditional means. In effect, the vortex channel acts like an ideal inductor with infinitely high permeability when it is fully superconducting, shorting the flux to its far side (the second coil), allowing the flux to move through what would otherwise be equivalent to a massive air gap without loss due to flux leakage. When Cooper pair breaking takes place, the vortex channel is forced to switch back into a (non-superconducting) ceramic, effectively adding a massive air gap into the magnetic loop and changing the reluctance of the magnetic circuit. Toggling the vortex channel allows the direct energy conversion generator to command passive conventional electrical components like an inductor to become inert and take on the physical properties of air.

Other objects, features and advantages of the present invention will be apparent to those skilled in the art upon a reading of this specification including the accompanying drawings.

BRIEF DESCRIPTION OF THE DRAWINGS

The invention is better understood by reading the following Detailed Description of the Preferred Embodiments with reference to the accompanying drawing figures, in which like reference numerals refer to like elements throughout, and in which.

DETAILED DESCRIPTION OF THE PREFERRED EMBODIMENTS

In describing preferred embodiments of the present invention illustrated in the drawings, specific terminology is employed for the sake of clarity. However, the invention is not intended to be limited to the specific terminology so selected, and it is to be understood that each specific element includes all technical equivalents that operate in a similar manner to accomplish a similar purpose.

Figure 1A:
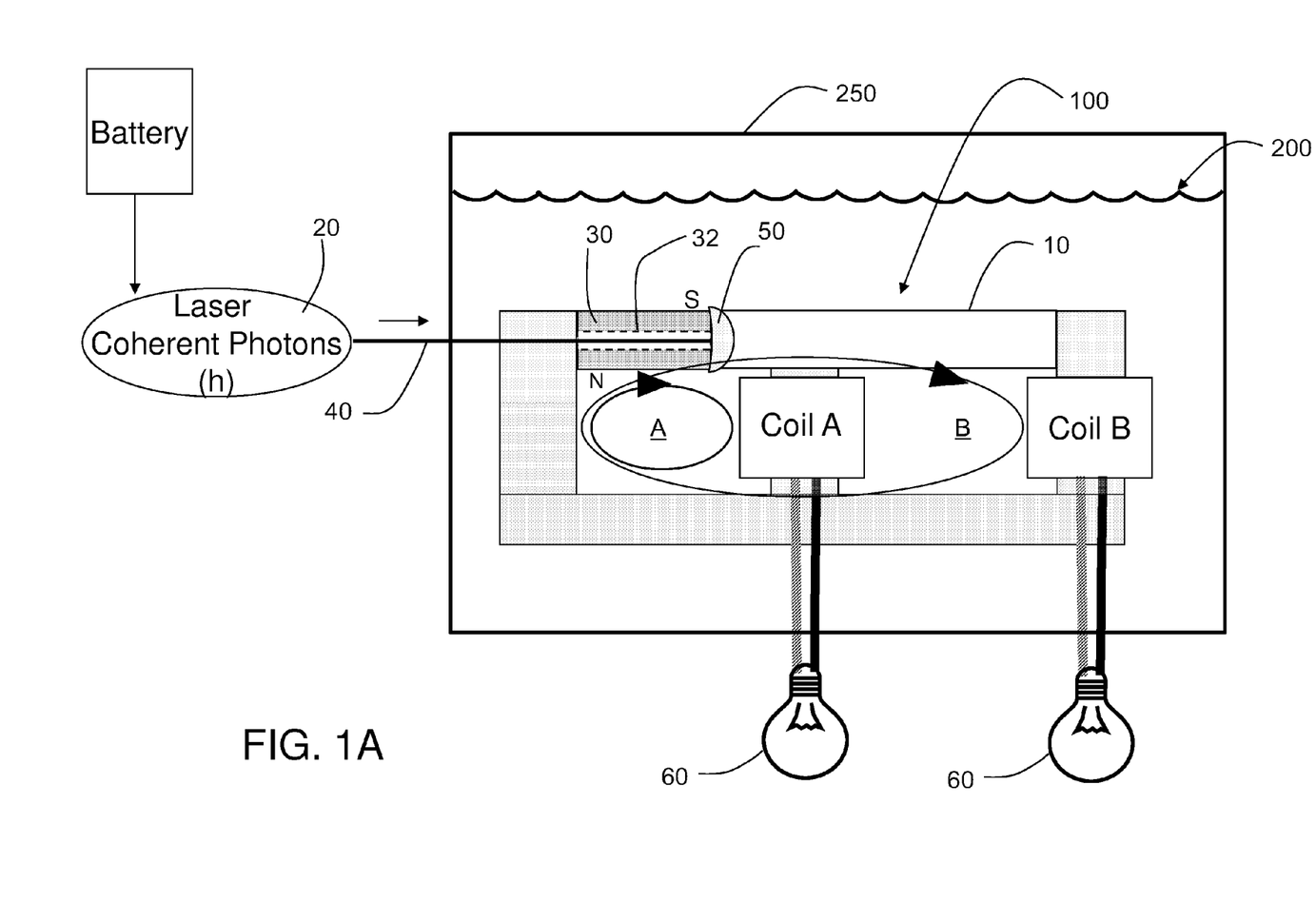
FIG. 1A is a schematic illustration of a direct energy conversion generator in accordance with the present invention.
Figure 1B:
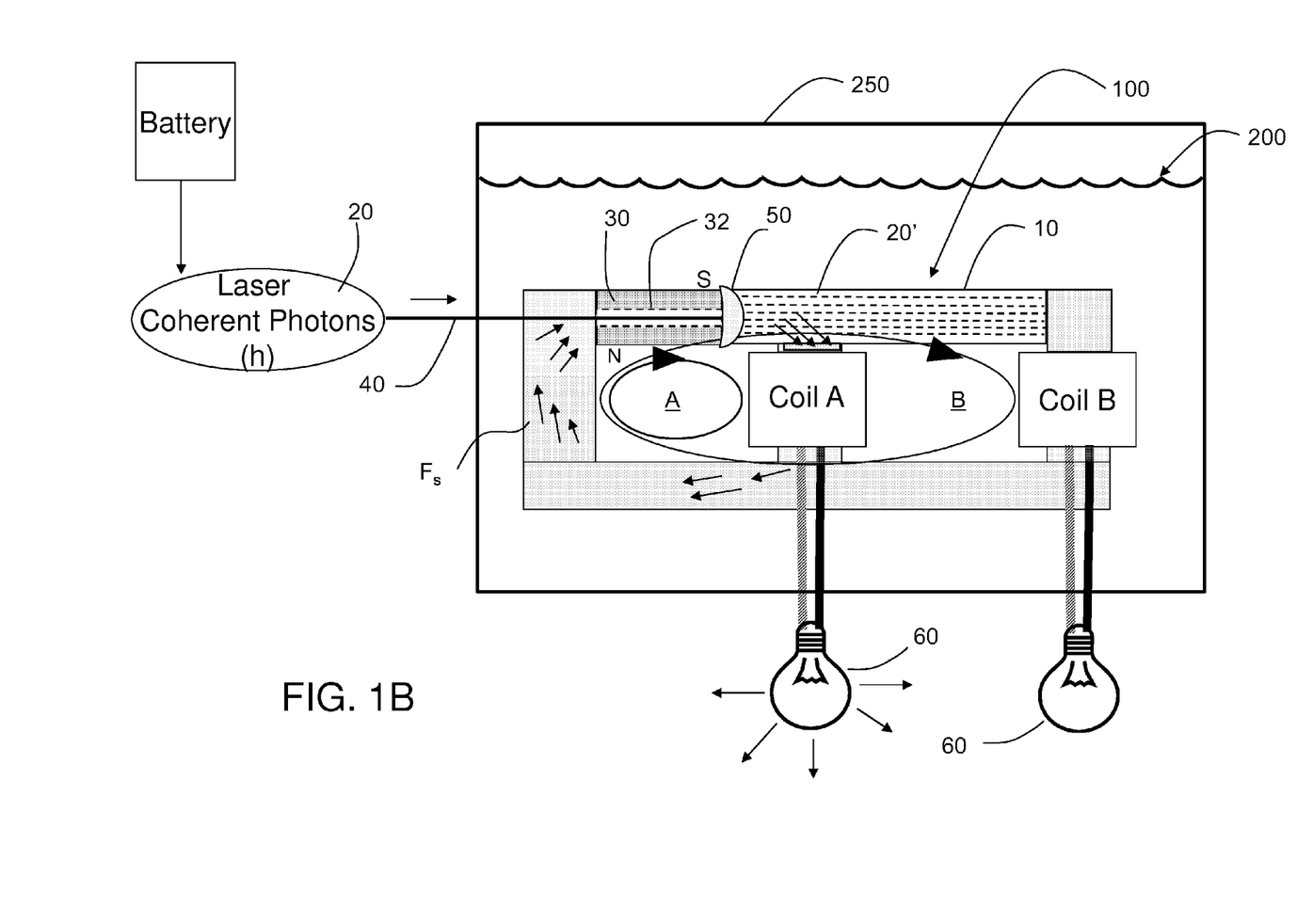
FIG. 1B is a schematic illustration of the magnetic flux path or loop of the direct energy conversion generator of FIG. 1A when the vortex channel is in the non-superconducting state.
Figure 1C:
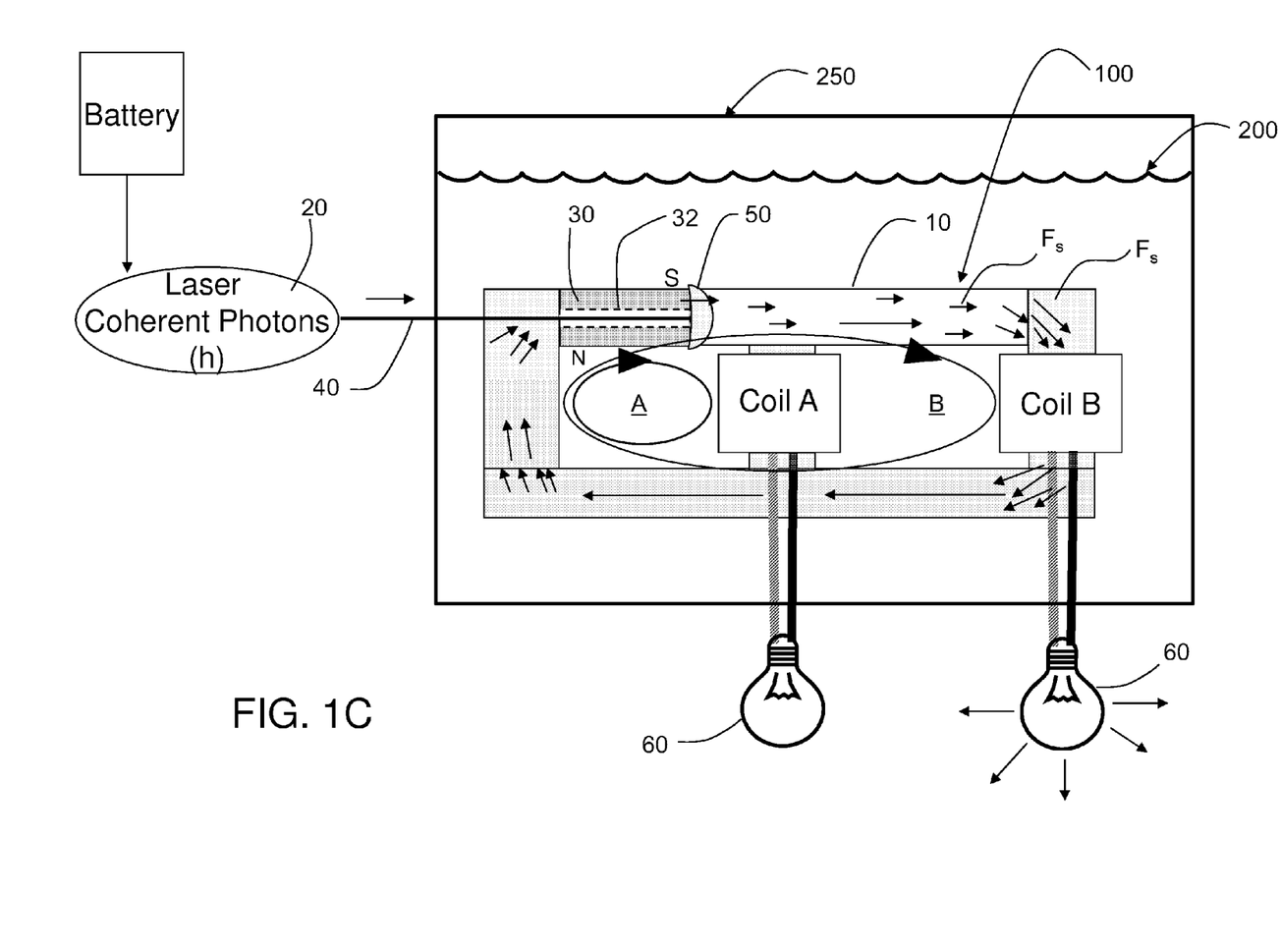
FIG. 1C is a schematic illustration of the magnetic flux path or loop of the direct energy conversion generator of FIG. 1A when the vortex channel is in the superconducting state.

The present invention is a direct energy conversion generator 100 (shown in FIGS. 1A-1C) that combines the known properties of Type II superconductors, including the Meissner Effect, to assist in the optical control of vortices to modulate static flux (indicated by the arrows $F_s$ in FIGS. 1B and 1C). In the direct energy conversion generator, flux is coupled in a conventional magnetic circuit as described in greater detail hereinafter, where the laws of induction are used to produce an electrical potential. The production of this electrical energy does not require the use of moving armatures.

Figure 2:
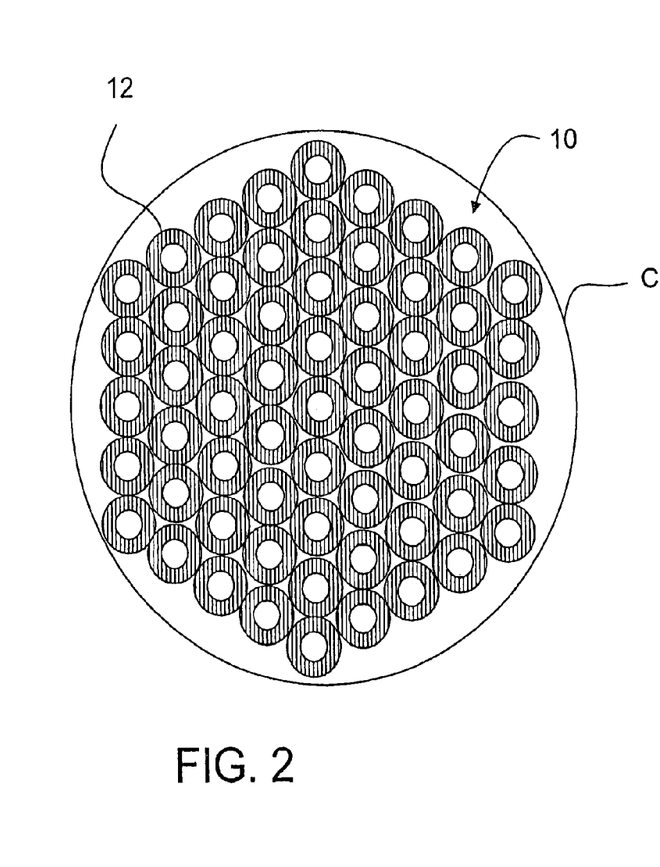
FIG. 2 is a cross-sectional view of the vortex channel of the direct energy conversion generator.
Figure 2A:
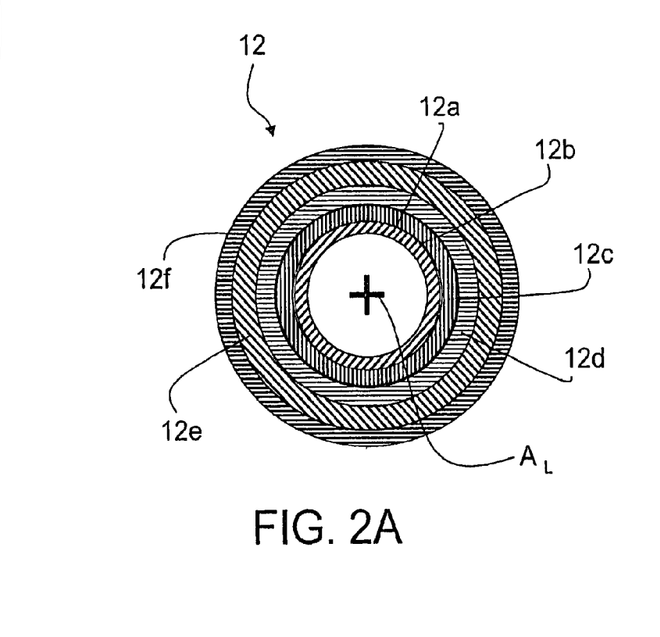
FIG. 2A is an enlarged, cross-sectional view of one of the vortex tubes of the vortex channel.

Referring now to FIGS. 2 and 2A, the direct energy conversion generator 100 employs a vortex channel 10 based on the Meissner Effect known to expel and pin a fixed magnetic field of a specific value emanating from the poles of a permanent magnet or an electromagnet. The vortex channel 10 comprises a plurality of vortex tubes 12 of circular cross-section arranged in a bundle with their longitudinal axes parallel to each other. As illustrated in FIG. 2, the bundle has an approximately circular cross-section (a circle C is superimposed on the cross-section of the vortex channel 10 for the purpose of illustrating its approximately circular shape). However, the cross-section need not be approximately circular, but can be any configuration, for example, approximately square, approximately rectangular, etc. The number of vortex tubes 12 in the bundle is on the order of hundreds or thousands.

As shown in FIG. 2A, the vortex tubes 12 are tubes 12a having an exterior surface 12b (which includes the tube ends), a first buffer layer 12c covering the exterior surface 12b, a second buffer layer 12d covering the first buffer layer, a Type II superconductor thin film 12e covering the second buffer layer, and an insulating layer 12f covering the superconductor thin film. As discussed in greater detail hereinafter, the vortex tubes 12 are switchable between a superconducting state and a non-superconducting state; and work together as a vortex channel 10 to guide static magnetic flux in one direction from one end of the vortex tubes 12 to the other, with very low or no loss, or at least very low losses.

In an exemplary embodiment, the vortex channel 10 is constructed of approximately 500 vortex tubes. Each tube 12a has a maximum 0.0125-inch outside diameter and a 1.0-inch length. The first buffer layer 12c is a thin film coating of $Y_2O_3$ stabilized with $ZrO_2$. The second buffer layer 12d is a thin film coating of cerium oxide ($CeO_2$). The superconductor thin film 12e is a thin film of YBCO. The insulating layer 12f is a very thin layer of Parylene.

Type II superconductor thin film (YBCO) is deposited over the second buffer layer 12d ($CeO_2$). The Type II superconductor to make a vortex tube, the exterior surface 12b of the tube 12a must first be cleaned of $SiO_2$, for example using an Excimer laser in a vacuum. The first buffer layer 12c (a thin film coating of $Y_2O_3$ stabilized with $ZrO_2$) keeps the tube material (Si) from migrating into the Type II superconductor thin film 12e (YBCO) and making it ineffective as a superconductor.

To improve the crystal lattice interface between the Type II superconductor thin film 12e (YBCO) and the first buffer layer 12c (thin film coating of $Y_2O_3$ stabilized with $ZrO_2$), a second buffer layer 12d is required. Cerium oxide ($CeO_2$) is selected for the second buffer layer 12d because it provides an ideal base for the deposit of the YBCO thin film. The second buffer layer 12d brings the error between the crystal lattice interface to ~0.5%. Next, a very thin film 12e of the thin film 12e (YBCO) is deposited in a very thin layer over the first and second buffer layers 12c and 12d so as to cover the exterior surface 12b of the tube without defects.

After the Type II superconductor thin film 12e (YBCO) is deposited, it is coated with a very thin layer of Parylene, which is an electrical insulator that is capable of coating the Type II superconductor thin film 12e (YBCO) one molecule at a time without gaps, to electrically isolate the vortex tubes 12 from each other, making the vortex generated within each vortex tube 12 operate independently of the vortices generated in the other vortex tubes 12, neutralizing the Lorentz force, and locking each vortex tube 12 to a fixed position within the vortex channel 10 so that each vortex tube 12 works independent of its neighbor.

Referring again to FIGS. 1A-1C, in addition to the vortex channel, the direct energy conversion generator 100 includes a laser 20, a permanent magnet or electromagnet 30 (preferably cylindrical) with an axial channel 32 coincident with the magnet's axis, fiber optics 40 for carrying photons from the laser 20 through the axial channel 32 of the magnet or electromagnet 30 to the vortex channel, a diffusing mechanism 50 between the permanent magnet or electromagnet 30 and the vortex channel 10 for evenly expanding the photon beam to the diameter of the vortex channel 10, and a transformer composed of two separate windings. The diffusing mechanism 50 can be a thin diffusing lens or any other mechanism that can diffuse the incoming photons from the point source provided by the fiber optics 40 into a larger area capable of covering the frontal surface area of the vortex channel 10. The permanent magnet or electromagnet 30, the vortex channel 10, and the transfer windings make up the rest of the circuit.

The transformer windings are arranged in a circuit having a first path A (shown in FIG. 1B) through the permanent magnet or electromagnet 30 and a first coil A of the transformer windings; and a second path B (shown in FIG. 1C) through the permanent magnet or electromagnet 30, the vortex channel 10, and the second coil B of the transfer windings. When the amount of magnetic flux flowing through the transformer windings changes due to modulation of the magnetic flux by the vortex channel, electricity is produced. This electricity can be used to power a load 60, for example, a light bulb.

The photons emitted by the laser 20 must have a wavelength that will be easily absorbed by the Cooper pairs in the Type II superconductor thin film and suppress superconductivity.

Thus, in the exemplary embodiment in which the Type II superconductor thin film 12e is YBCO, the laser 20 has a wavelength and with a power output selected to achieve maximum electron-photon conversion efficiency. The transformer conventionally includes a ferromagnetic core (for example, soft ferrites) and windings made of a conductive material like copper wire or a superconductive wire.

Figure 3:
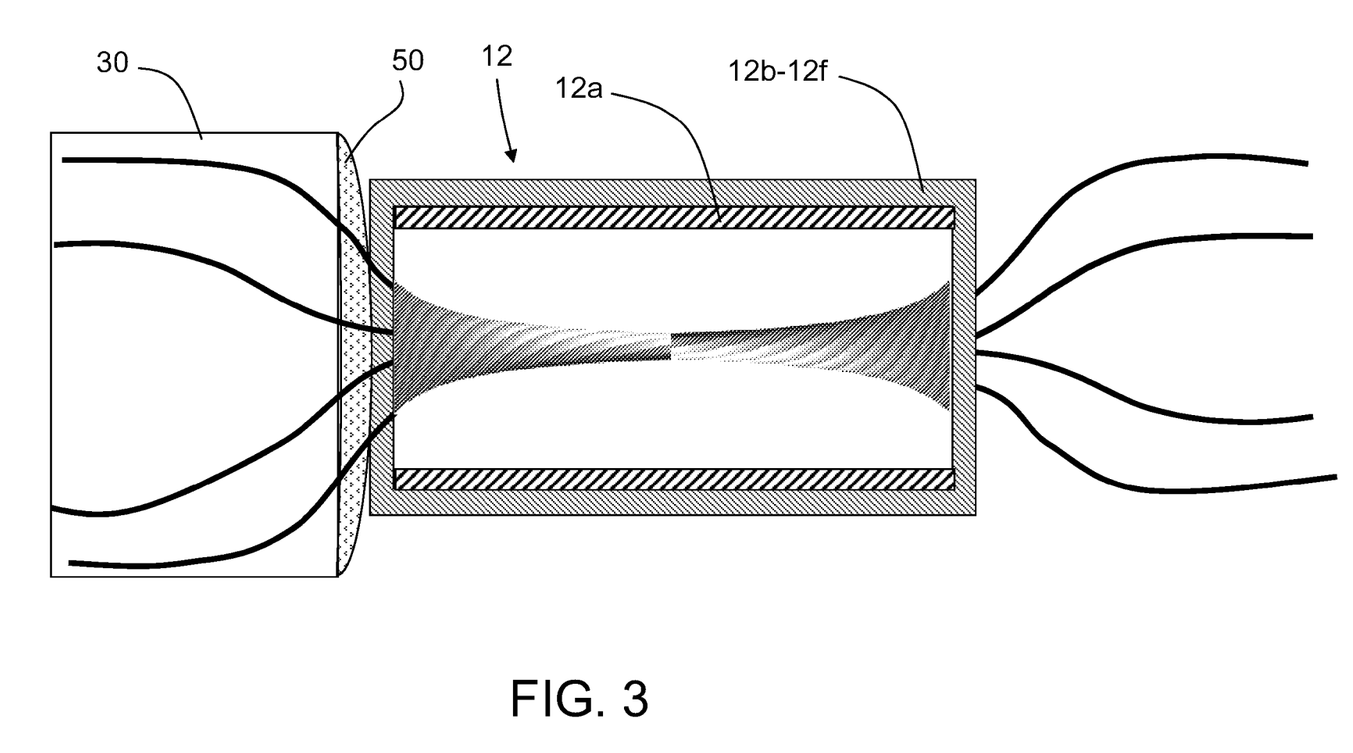
FIG. 3 is a schematic illustration showing the manner in which static flux is compressed and twisted as it enters the center of each vortex tube and is conducted into a very high virtual permeability thread.

As shown in FIG. 3, static flux is compressed and twisted as it enters the center of each vortex tube 12 and is conducted into a very high virtual permeability thread where it is maintained at a distance from the outside surface of the vortex tube 12. Reflection of the static flux induces a thin sheet of current, so that the current sheet acts like a moving mirror reflecting back the magnetic flux with the same polarity and force with which it was received. The thin sheet of current covers the circumference of the vortex tubes 12 along their full lengths, compressing the static flux over the full lengths of the vortex tubes 12 and thus over the full length of the vortex channel 10.

When the vortex channel 10 is in the non-super conducting state (FIG. 1B), it acts as a ceramic or insulator having the permeability of air, static flux is free to flow through path A. When the vortex channel 10 is in the superconducting state (FIG. 1C), it guides static flux quanta through the vortex channel 10, which is a low energy magnetic circuit for the purpose of generating electrical energy. The static magnetic flux is held in a compressed closed loop, and static flux flows through path B.

Each vortex tube 12 can only handle a given amount of static flux before it will saturate. The vortex channel 10 therefore must be made up of enough vortex tubes 12 to spread out the static flux by passing it through their open centers away from the Type II superconductor thin film when the Type II superconductor thin film 12e is in its superconducting state. The vortex channel, while in its superconducting state, produces a super high virtual permeability state, as a result, provides a new low energy path for the static flux to flow through. The higher the permeability, the less energy it takes for the static flux to flow. Static flux always takes the path of least resistance, i.e., lowest energy path.

Figure 4:
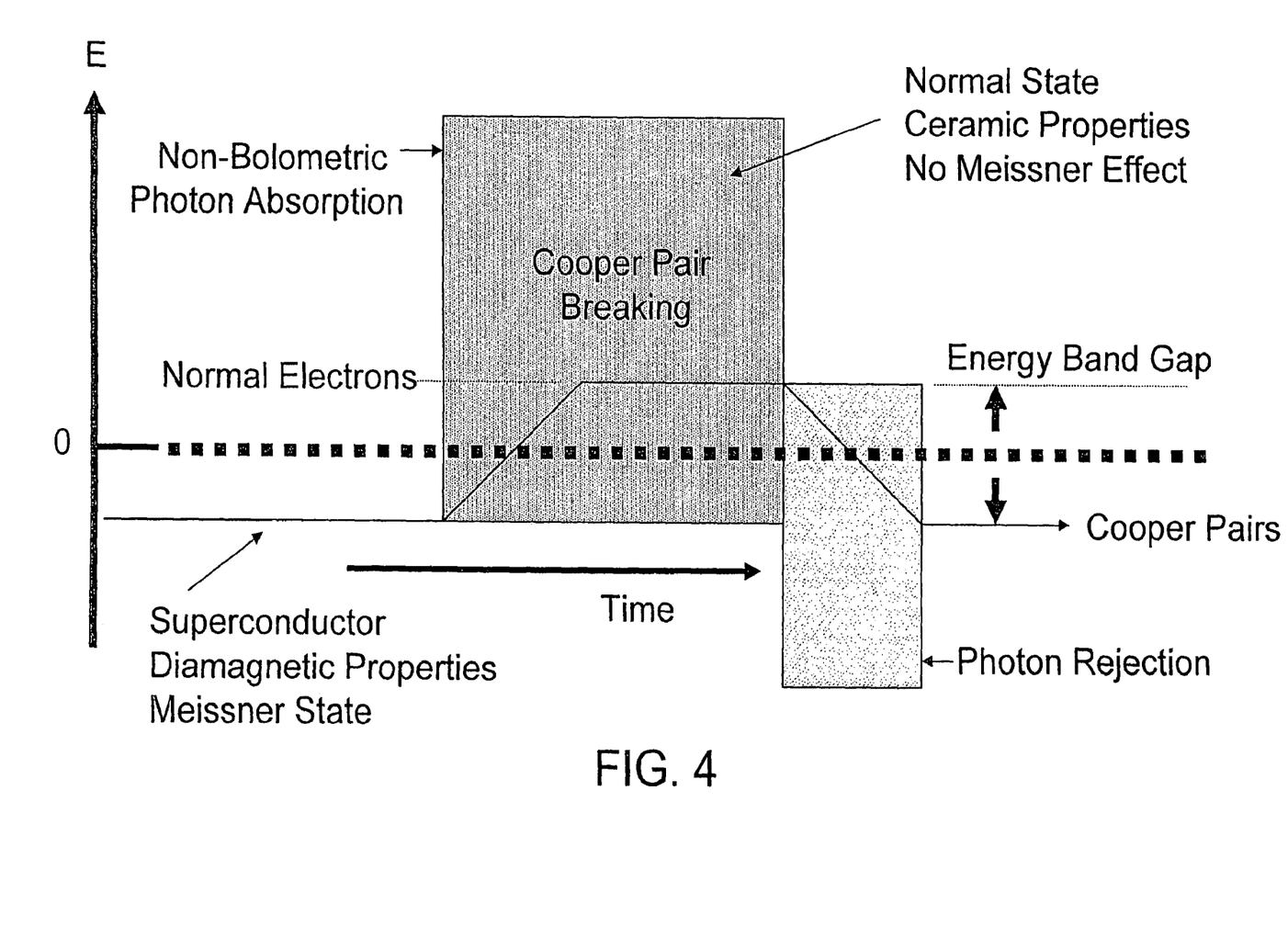
FIG. 4 is a graph illustrating how the vortex channel acts as a photon-activated switch used to modulate the static magnetic field of the permanent magnet of the direct energy conversion generator.

FIG. 4 is a graph illustrating how the vortex channel 10 acts as a photon activated magnetic switch to modulate the magnetic field of the permanent magnet or electromagnet 30 of the direct energy conversion generator 100. When the Type II superconductor thin film 12e is in its superconducting state, the combination of the Meissner Effect and the atomic elastic forces between the electrons and the static flux results in flux pinning at the center of the vortex tubes. The direct energy conversion generator 100 can operate at much higher flux density than would otherwise be possible, because the static flux does not come into direct contact with the superconducting thin film.

In the normal (that is, the non-superconducting) state, the vortex channel 10 does not affect the magnetic path, because the vortex channel 10 (and more specifically, the superconductor thin film 12e that coats the vortex tubes 12) is just a non-superconducting ceramic, with no known magnetic properties of any kind. Static flux emanating off the south pole of the permanent magnet or electromagnet 30 is coupled or linked to the magnetic path provided by the inductor in path A and returned to the north pole by the magnetic path provided by the inductor loop completing the magnetic loop.

Figures 5, 5A:
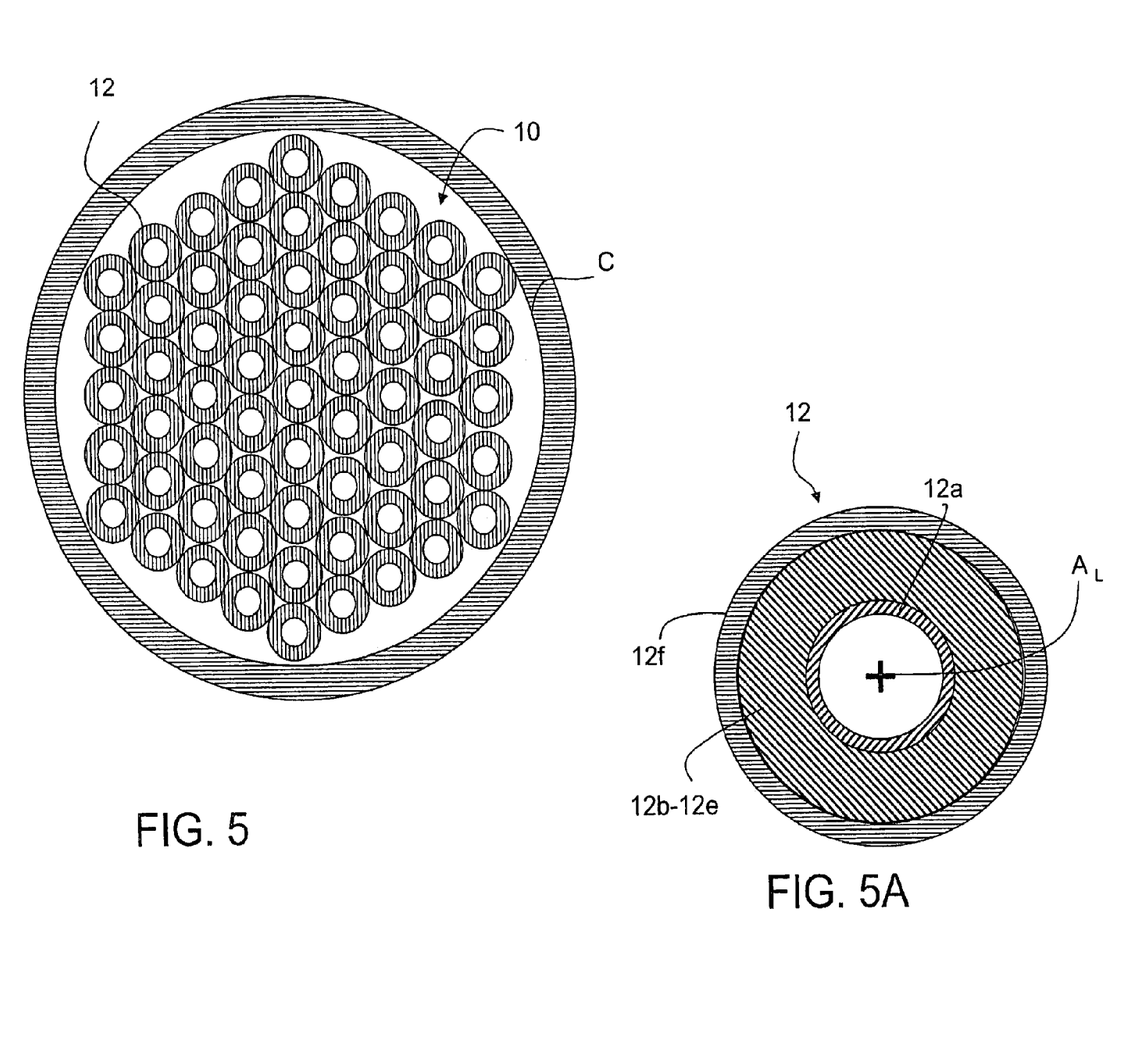
FIG. 5 is the cross-sectional view of the vortex channel as shown in FIG. 2, illustrating the area of influence surrounding the channel of the direct energy conversion generator.
FIG. 5A is the cross-sectional view of the vortex tube of FIG. 2A, illustrating the area of influence surrounding the vortex tube.

In addition, the atomic forces found in the crystal lattice structure of the Type II superconductor thin film 12e play a role in pinning the static flux. These forces are applied evenly around the circumference of each vortex tube 12 along its entire length, analogous to the manner in which a magnetic field is evenly distributed around the circumference of a wire along its entire length when current is flowing through that wire. Each vortex tube 12 acts independently, pulling flux quanta into its center. The area of influence is much greater than the frontal area of each vortex tube, as shown in FIGS. 5 and 5A. More energy is required for magnetic flux to take a path outside of this area of influence of the vortex tube 12 than to take a path within the area of influence. Only the longitudinal axis $A_L$ the vortex tube 12 represents the lowest energy path or the preferred path.

By combining many man made vortex tubes 12 together an artificial or virtual high permeability vortex channel 10 is defined. A disk of virtual high permeability rotates at the front or upstream end of each vortex tube 12. This virtual high permeability increases radially in an inward direction from the circumference to the longitudinal axis of each vortex tube 12, providing an ever-increasing pinning force that induces the flux quanta to flow towards the longitudinal axis of each vortex tube 12 and away from its outer surface.

This pinning is only possible because the Type II superconducting material resists the penetration of the static flux emanating off the surface of one of the poles of the permanent magnet. This static flux bias causes the Type II superconductor to develop a counter force.

A process known as "photon Cooper breaking" is used to toggle the Type II superconductor thin film 12e between the superconducting state and the non-superconducting state, thereby providing a time-varying magnetic field enabling power to be extracted using traditional means. In effect, the vortex channel 10 acts like an ideal inductor with infinitely high permeability when it is fully superconducting, shorting the static flux to its far side (coil B), allowing the static flux to move through what would otherwise be equivalent to a massive air gap without loss due to flux leakage. When Cooper pair breaking takes place, the vortex channel 10 is forced to switch back into a (non-superconducting) ceramic, effectively adding a massive air gap into the magnetic loop and changing the reluctance of the magnetic circuit. It is noted that when the YBCO thin film is in the superconducting state it is a perfect diamagnetic material, rather than a ceramic. Toggling the vortex channel 10 allows the direct energy conversion generator 100 to command passive conventional electrical components like an inductor to become inert and take on the physical properties of air.

When a photon of the correct energy level and wavelength is shot into the Type II superconductor, the photon is absorbed by one of the electrons forming the Cooper pair. This infusion of photon energy causes the Cooper pair to break apart, and superconductivity is suppressed.

The vortex channel 10 exhibits a very large permeability shift at its upstream end, and thus can be used to modulate the static flux. Once the additional energy from the photons is introduced into the device, the static flux emanating from the poles of the permanent magnet or electromagnet 30 can be re-directed so it can be modulate through transfer coils, producing conventional electrical energy.

When the source of photons (that is, the laser 20) is turned off, the electrons equilibrate and drop back into Cooper pairs, giving rise to the superconducting state.

Figure 6:
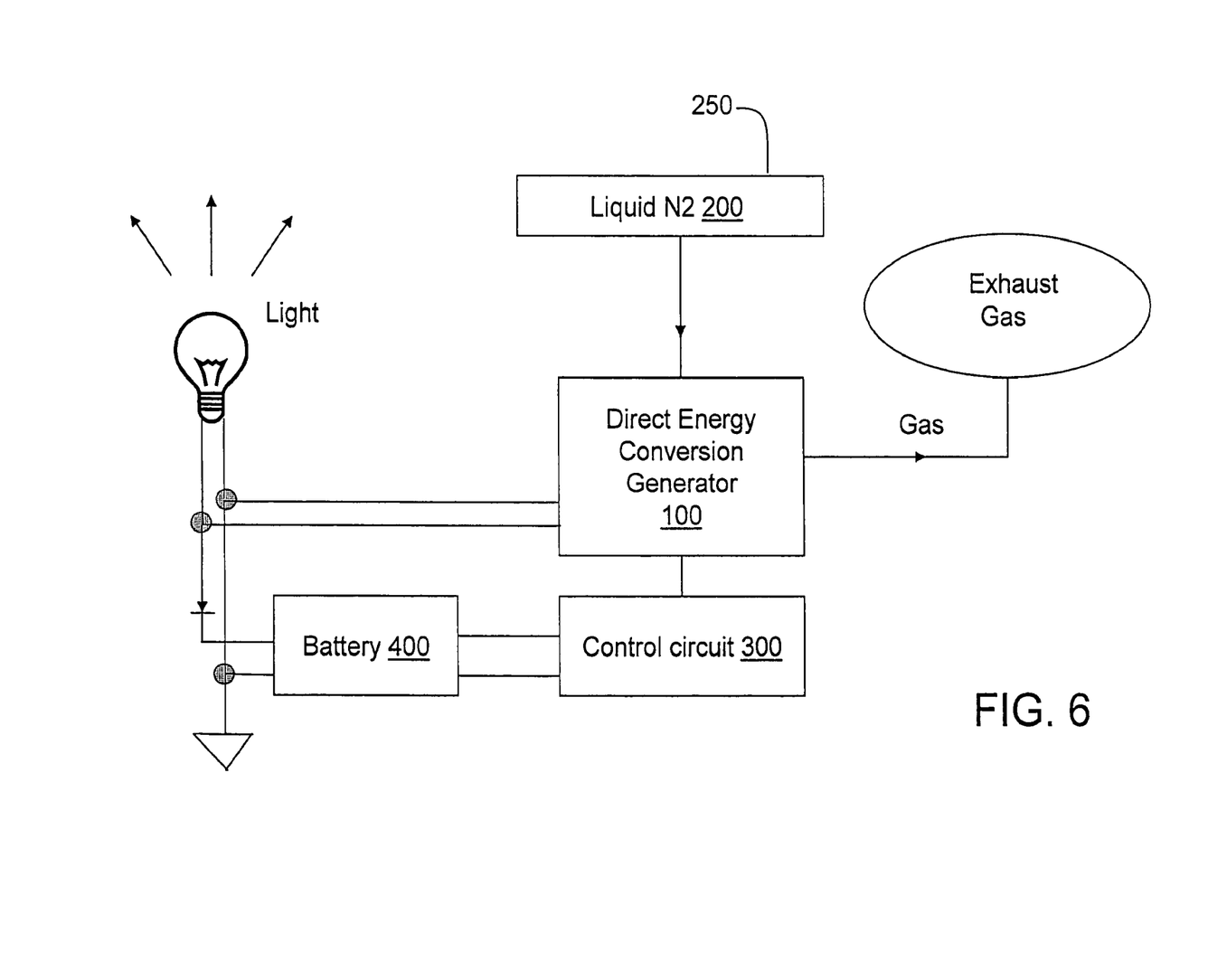
FIG. 6 is a schematic illustration of the direct energy conversion generator in use as a source of electrical energy.

As shown in FIG. 6, the direct energy conversion generator 100 requires for its operation a cryogenic liquid 200 to maintain the Type II superconductor thin film 12e below its transition temperature $T_c$ and thus maintain its superconducting state, as well as a Dewar vessel 250 for containing the cryogenic liquid 200, control circuit 300 for executing control logic, and a battery 400 or other power source to provide power to the laser 20 and control circuit 300.

The control circuit 300 is designed to provide pulse width modulation (PWM) of the laser output and to regulate the output of the direct energy conversion generator 100 for a given load. The technology of such control circuits 300 is well developed, and the design and construction of such a control circuit 300 is well within the ordinary skill in the art.

Any cryogenic liquid capable of maintaining the superconductor below its transition temperature can be used; but liquid nitrogen ("$LN_2$") is preferred because it is the most practical and will have the lowest cost of operations.

Operational heat losses evaporate the $LN_2$ 200 using the known process of "Latent Heat of Vaporization" (in which the state of a cryogenic liquid is changed from a liquid to a gas). The $LN_2$ 200 boils off as a gas due to waste heat manufactured from the production of electrical energy and evaporates into the open space or atmosphere, where it is dispersed without adverse ecological effects because nitrogen gas represents approximately 78% of our present atmosphere. Once all the cryogenic liquid has changed to a gas state, the electrical generating process or cycle ends.

In effect, the direct energy conversion generator 100 is solid state, having no moving parts.

Figure 7:
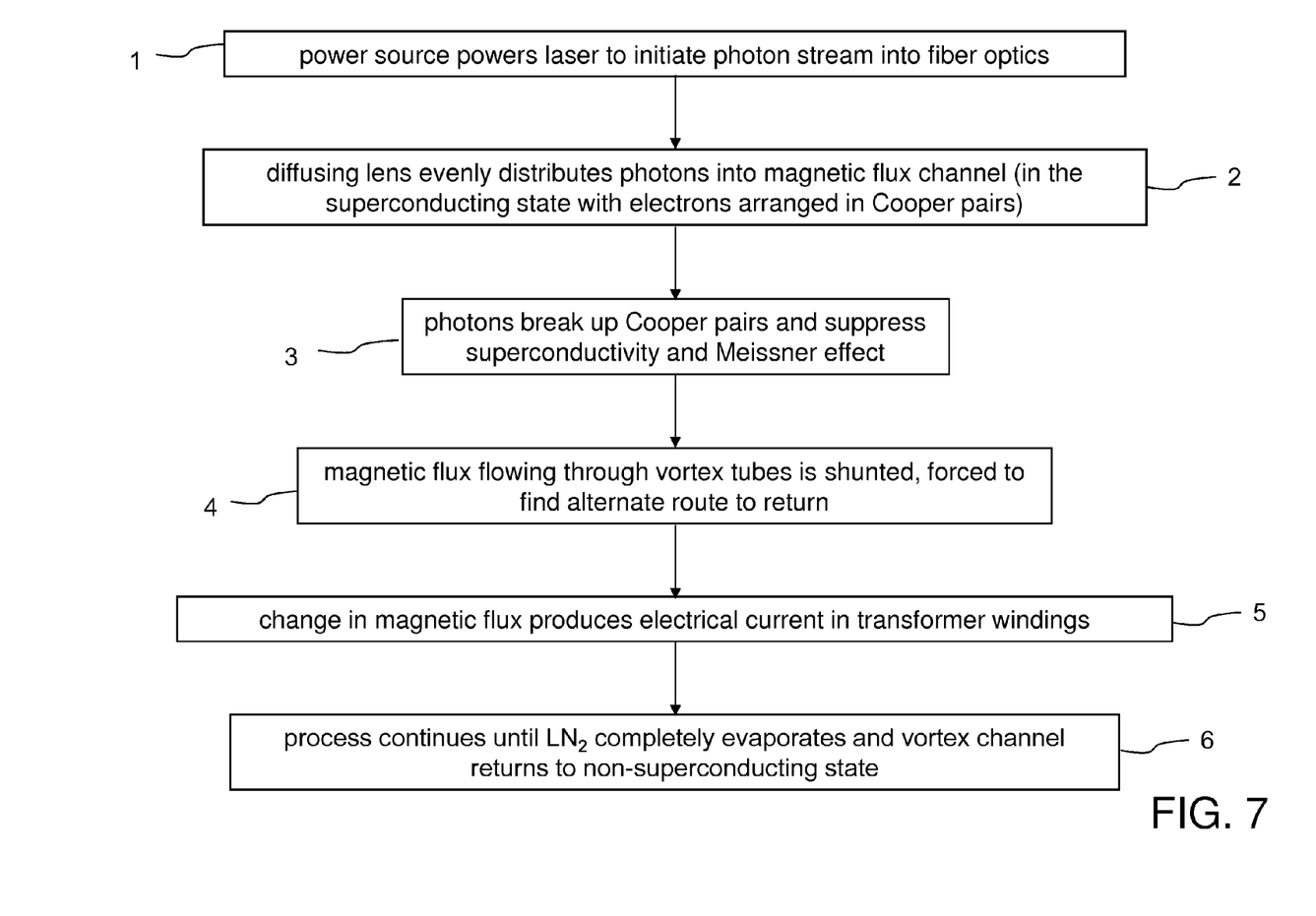
FIG. 7 is a flow diagram showing the energy conversion process carried out by the direct energy conversion generator in accordance with the present invention.

With reference to FIG. 7, the energy conversion process carried out by the direct energy conversion generator 100 includes the following steps:

Step 1—a power source 400 (for example, a small battery) powers a small laser 20 to initiate a photon stream into the fiber optics 40;

Step 2—the diffusing lens 50 evenly distributes the photons into the vortex channel, which is in the superconducting state, so that the photons interact with the electrons in the Type II superconductor thin film 12*e* arranged in Cooper pairs;

Step 3—the photons break up the Cooper pairs and suppress superconductivity and the Meissner effect;

Step 4—magnetic flux flowing through the vortex tubes 12 is shunted, forced to find an alternate route to return;

Step 5—the change in magnetic flux produces electrical current in the transfer windings; and Step 6—the process continues until the $LN_2$ completely evaporates and the vortex channel 10 returns to the non-superconducting state.

Modifications and variations of the above-described embodiments of the present invention are possible, as appreciated by those skilled in the art in light of the above teachings. It is therefore to be understood that, within the scope of the appended claims and their equivalents, the invention may be practiced otherwise than as specifically described.

What is claimed is:

1. A direct energy conversion generator comprising:
   magnet means for generating static magnetic flux;
   vortex channel means for channeling and modulating the static magnetic flux, the vortex channel means having a first state in which it acts like an ideal inductor with infinite permeability and a second state in which it acts as a massive air gap having the permeability of air;
   toggling means for selectively toggling the vortex channel means between its first and second states by introducing at least one of heat, photons, RF energy, magnetic energy and electrical current into the vortex channel means;
   a power source providing power to the toggling means;
   electric current-producing means for producing electric current from modulation of the static magnetic flux; wherein
   the vortex channel means is connected to a transformer having a first magnetic circuit path with a first winding to allow the magnetic flux to flow through when the vortex channel means is in the first state; and
   a second magnetic circuit path with a second winding to allow the magnetic flux to flow through when the vortex channel means is in the second state.

2. The direct energy conversion generator of claim 1, wherein the first state of the vortex channel means is a superconducting state and the second state is a non-superconducting state.

3. The direct energy conversion generator of claim 2, wherein the toggling means uses photon Cooper breaking to toggle the vortex channel means from the superconducting state to the non-superconducting state.

4. The direct energy conversion generator of claim 3, wherein the vortex channel means comprises a plurality of vortex tubes of a specific cross-section arranged in a bundle with their longitudinal axes parallel to each other, wherein each of the vortex tubes is a tube having a multiple-layer coating over its exterior surface, and wherein one of the layers is a Type II superconductor thin film.

5. The direct energy conversion generator of claim 4, wherein the multiple-layer coating has four layers, wherein the first layer is a first buffer layer covering the exterior surface, the second layer is a second buffer layer covering the first buffer layer, the third layer is the Type II superconductor thin film and covers the second buffer layer, and the fourth layer is an insulating layer covering the superconductor thin film.

6. A direct energy conversion method using the direct energy conversion generator of claim 1, comprising the steps of:
   generating static magnetic flux using the magnet means;
   selectively toggling the vortex channel means between its first and second states using the toggling means, to cause magnetic flux to flow alternately through the first transformer winding in the first magnetic circuit path when the vortex channel means is in the first state and through the second transformer winding in the second magnetic circuit path when the vortex channel means is in the second state, whereby electric current is produced by a changing amount of magnetic flux flowing through the first and second transformer windings; and
   using the electric current produced by the changing amount of magnetic flux flowing through the first and second transformer windings to power a load.

7. The direct energy conversion method of claim 6, wherein the first state of the vortex channel means is a superconducting state and the second state is a non-superconducting state.

8. The direct energy conversion method of claim 7, wherein the toggling means uses photon Cooper breaking to toggle the vortex channel means from the superconducting state to the non-superconducting state.

9. The direct energy conversion generator of claim 1, wherein said toggling means introduces a photon beam into the superconducting material and wherein the direct energy conversion generator further comprises a diffusing mechanism between said magnet means and said vortex channel means for evenly expanding the photon beam to the diameter of said vortex channel means.

10. A direct energy conversion electric generator comprising:
    means for producing a static magnetic flux;
    a channel made at least in part from a Type II superconducting material, wherein said channel channels the static magnetic flux when the Type II superconducting material is in a superconducting state, causing rotating Cooper pairs around the exterior surface of said channel to create a large pinning force along the longitudinal axis of the channel, pinning flux quanta at the center of said longitudinal axis; and
    acts as a massive air gap preventing the flow of said static magnetic flux when the Type II superconducting material is in a non-superconducting state;
    toggling means for selectively toggling said channel between its superconducting and non-superconducting states by introducing least one of heat, photons, RF energy, magnetic energy and electrical current into the superconducting material;
    a power source for providing power to said toggling means; and
    electric current-producing means for producing electric current from the change of flow of the static magnetic flux through said channel.

11. The direct energy conversion generator of claim 10, wherein said toggling means modulates vortices in the Type II superconducting material when in said superconducting state by introducing excitation photons of a relatively constant energy and wavelength.

12. The direct energy conversion generator of claim 10, wherein said electric current-producing means includes one of a coil and a loop, wherein said toggling means forces the Type II superconducting material to revert to a non-superconducting state in a given time period for modulating the static magnetic flux to produce a counter EMF in the coil or single loop from which an electrical current is produced.

13. The direct energy conversion generator of claim 10, wherein said channel comprises a plurality of vortex tubes of specific cross-section arranged in a bundle with their longitudinal axes parallel to each other, wherein each of said vortex tubes is a tube having a multiple-layer coating over its exterior surface, and wherein one of the layers is a Type II superconductor thin film.

14. The direct energy conversion generator of claim 13, wherein said multiple-layer coating has four layers, wherein the first layer is a first buffer layer covering the exterior surface, the second layer is a second buffer layer covering the first buffer layer, the third layer is the Type II superconductor thin film and covers the second buffer layer, and the fourth layer is an insulating layer covering the superconductor thin film.

15. The direct energy conversion generator of claim 14, wherein the toggling means utilizes photons to force Cooper pairs in the type II superconducting material to break up, causing the channel to act as a solid state variable magnetic air gap.

16. The direct energy conversion generator of claim 13, wherein said channel channels said magnetic flux, allowing the flux quanta to be pinned at the center of the longitudinal axis of said vortex tubes.

17. The direct energy conversion generator of claim 10, wherein said toggling means introduces a photon beam into said Type II superconducting material and wherein the direct energy conversion generator further comprises a diffusing mechanism between said means for producing a static magnetic field and said channel for evenly expanding said photon beam to the cross-section of said channel.

18. The direct energy conversion generator of claim 10, wherein said channel is effectively an inductor, said toggling means introduces photons to force Cooper pairs in the type II superconducting material to break up, switching said channel into said non-superconducting state, wherein said channel effectively takes on the permeability property of air.

* * * * *